(12) United States Patent
Sun et al.

(10) Patent No.: US 10,886,341 B2
(45) Date of Patent: Jan. 5, 2021

(54) DISPLAY PANEL AND METHOD FOR PREPARING THE SAME, DISPLAY PANEL MOTHERBOARD AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Shi Sun, Beijing (CN); Xuewu Xie, Beijing (CN); Hao Liu, Beijing (CN); Yubao Kong, Beijing (CN); Yu Al, Beijing (CN); Bowen Liu, Beijing (CN); Ameng Zhang, Beijing (CN); Yang Xu, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/551,171

(22) Filed: Aug. 26, 2019

(65) Prior Publication Data
US 2020/0194517 A1 Jun. 18, 2020

(30) Foreign Application Priority Data
Dec. 14, 2018 (CN) .......................... 2018 1 1534194

(51) Int. Cl.
*H01L 51/50* (2006.01)
*H01L 27/32* (2006.01)
(Continued)

(52) U.S. Cl.
CPC .......... *H01L 27/3244* (2013.01); *H01L 22/30* (2013.01); *H01L 51/003* (2013.01); *H01L 51/0097* (2013.01); *H01L 51/56* (2013.01)

(58) Field of Classification Search
None
See application file for complete search history.

(56) References Cited

U.S. PATENT DOCUMENTS

2010/0045919 A1* 2/2010 Chida .................... H01L 27/124
349/149
2019/0058121 A1* 2/2019 Tanaka ..................... H01L 27/32
(Continued)

FOREIGN PATENT DOCUMENTS

CN 105810717 A 7/2016

*Primary Examiner* — Benjamin P Sandvik
(74) *Attorney, Agent, or Firm* — Brooks Kushman P.C.

(57) ABSTRACT

The present disclosure provides a display panel, a method for preparing the same, and a display panel motherboard. The method for preparing the display panel includes: providing a support substrate; forming a base substrate on a surface of the support substrate; providing a mask plate on another surface; before forming a structure sensitive to laser irradiation on the base substrate, irradiating a surface of the support substrate with a laser, such that the at least one region irradiated by the laser is separated from the support substrate, and a region of the base substrate not irradiated by the laser remains bound to the support substrate, then forming a pixel structure in each of the display panel sub-region of the substrate, to obtain a display panel motherboard; and then cutting the display panel motherboard to obtain at least one separate display panel.

10 Claims, 6 Drawing Sheets

(51) Int. Cl.
*H01L 21/66* (2006.01)
*H01L 51/00* (2006.01)
*H01L 51/56* (2006.01)

(56) References Cited

U.S. PATENT DOCUMENTS

2019/0363299 A1* 11/2019 Kishimoto ............ H01L 51/003
2019/0386066 A1* 12/2019 Cai ....................... H01L 51/003

* cited by examiner

DISPLAY PANEL AND METHOD FOR PREPARING THE SAME, DISPLAY PANEL MOTHERBOARD AND DISPLAY DEVICE

CROSS-REFERENCE TO RELATED APPLICATION

This application claims priority to Chinese Patent Application No. 201811534194.8 filed on Dec. 14, 2018, which is incorporated herein by reference in its entirety.

TECHNICAL FIELD

The present disclosure relates to a field of display technology, and especially to a display panel and a method for preparing the same, a display panel motherboard, and a display device including the same.

BACKGROUND

An organic light-emitting diode (OLED) display panel has the advantages of self-luminous, high contrast, thin thickness, wide viewing angle and fast response speed. The flexible OLED display panel, especially flexible OLED display panel is an important development direction. The flexible OLED display panels are not only thinner in size but also lower in power consumption, which facilitates to improve the endurance of the corresponding products. In addition, due to its bendability and flexibility, the flexible OLED display panel is also more durable than conventional rigid display panels. The flexible display panel can be widely used in various products with display functions, for example, in tablets, televisions, mobile terminals, and various types of wearable devices.

SUMMARY

In one aspect, the present disclosure provides a method for preparing a display panel, including: providing a support substrate; forming a base substrate on a surface of the support substrate; providing a mask plate on anther surface of the support substrate opposite to the one surface and away from the base substrate; before forming a structure sensitive to laser irradiation on the base substrate, irradiating a surface of the support substrate provided with a mask plate with a laser, in which the mask plate includes at least one of light-transmitting region, and at least one region of the base substrate is irradiated by a laser through the at least one light-transmitting region and the support substrate, such that the at least one region of the base substrate irradiated by the laser is separated from the support substrate, and a region of the base substrate not irradiated by the laser remains bound to the support substrate, and in which the at least one region of the base substrate being irradiated by a laser is a display panel region, the display panel region comprises at least one display panel sub-region and the region of the base substrate not irradiated by the laser is a non-display panel region; then forming a pixel structure in each of the display panel sub-region of the base substrate, to obtain a display panel motherboard; and then cutting the display panel motherboard to obtain at least one separate display panel.

Optionally, the display panel sub-region includes a display region and a non-display region arranged around the display region, the step of cutting the display panel motherboard includes cutting along the edge of the display panel sub-region or in the non-display region of the display panel sub-region, to obtain at least one display panel, in which the base substrate is separated from the support substrate.

Optionally, the cutting the display panel motherboard includes cutting along a line in the display panel sub-region at a distance of about 10 μm from the edge of the display panel sub-region.

Optionally, in the step of cutting, only the base substrate and the structure formed on the base substrate are cut without cutting the support substrate.

Optionally, the cutting is performed using a laser process.

Optionally, the support substrate is a support substrate recycled after being cut by a laser to remove the base substrate.

Optionally, the base substrate is a flexible substrate, the display panel is a flexible display panel, and the step of forming the base substrate on a surface of the support substrate includes: coating a polyimide solution on a surface of the support substrate to form the flexible substrate.

Optionally, in the irradiating the surface of the support substrate provided with the mask plate with the laser, the laser has irradiation energy ranging from about 290 to about 350 mJ and a wavelength ranging from about 300 to about 400 nm.

Optionally, the display panel sub-region includes a display region and a non-display region arranged around the display region, in which the pixel structure includes a plurality of control elements and a plurality of light-emitting devices which are stacked, and the plurality of control elements include at least a semiconductor layer sensitive to laser irradiation, and/or the plurality of light-emitting devices include at least a light-emitting layer sensitive to laser irradiation.

Optionally, the plurality of control elements are thin film transistors, and the plurality of light-emitting devices include organic light-emitting diodes or quantum dot light-emitting diodes.

Optionally, the method further includes: forming a plurality of edge leads and a plurality of driving circuits for driving the pixel structure in the non-display region; and forming a test structure in the non-display panel region by the same patterning process as that for preparing a layer structure of the pixel structure, in which the test structure includes an array test pad for electrically testing the plurality of control elements and an optical test pad for optically testing the plurality of light-emitting devices.

In another aspect, the present disclosure provides a display panel motherboard, including a support substrate, a base substrate formed on a surface of the support substrate, and at least one pixel structure formed on a surface of the base substrate away from the support substrate, in which the display panel motherboard includes a display panel region and a non-display panel region arranged around the display panel region, the display panel region comprises at least one display panel sub-region and the pixel structure is provided in each of the display panel sub-region of the base substrate; in which each part of the base substrate located in the display panel sub-region is separated from the support substrate, and a part of the base substrate located in the non-display panel region remains bound to the support substrate; and in which the display panel motherboard is free of a light-shielding layer.

Optionally, the base substrate is a flexible substrate, and the display panel is a flexible display panel, and in which the display panel comprises a display panel region and a non-display panel region, the display panel region comprises at least one display panel sub-region, and the display panel sub-region includes a display region and a non-display region arranged around the display region, the pixel structure is arranged in the display region, and the non-display region is provided with a plurality of edge leads and a plurality of driving circuits for driving the pixel structure.

Optionally, the pixel structure includes a plurality of control elements and a plurality of light-emitting devices which are stacked, and the plurality of control elements include at least a semiconductor layer sensitive to laser irradiation, and/or the plurality of light-emitting devices include at least a light-emitting layer sensitive to laser irradiation.

Optionally, the plurality of control elements are thin film transistors, and the plurality of light-emitting devices include organic light-emitting diodes or quantum dot light-emitting diodes.

Optionally, the display panel motherboard further includes a test structure formed in the non-display panel region, in which the test structure includes an array test pad for electrically testing the plurality of control elements and an optical test pad for optically testing the plurality of light-emitting devices.

In one aspect, the present disclosure provides a display panel, including a base substrate and a pixel structure arranged on the base substrate, in which the display panel is free of a light-shielding layer, and wherein the pixel structure comprises a plurality of control elements and a plurality of light-emitting devices which are stacked, and the plurality of control elements comprise at least a semiconductor layer sensitive to laser irradiation, and/or the plurality of light-emitting devices comprise at least a light-emitting layer sensitive to laser irradiation.

Optionally, the base substrate is a flexible substrate, and the display panel is a flexible display panel, and in which the display panel sub-region includes a display region and a non-display region arranged around the display region, in which the pixel structure is arranged in the display region, and the non-display region is provided with a plurality of edge leads and a plurality of driving circuits for driving the pixel structure.

Optionally, the plurality of control elements are thin film transistors, and the plurality of light-emitting devices include organic light-emitting diodes or quantum dot light-emitting diodes.

In a further aspect, the present disclosure provides a display device, including the flexible display panel of any of the above.

DETAILED DESCRIPTION

Figure 1:
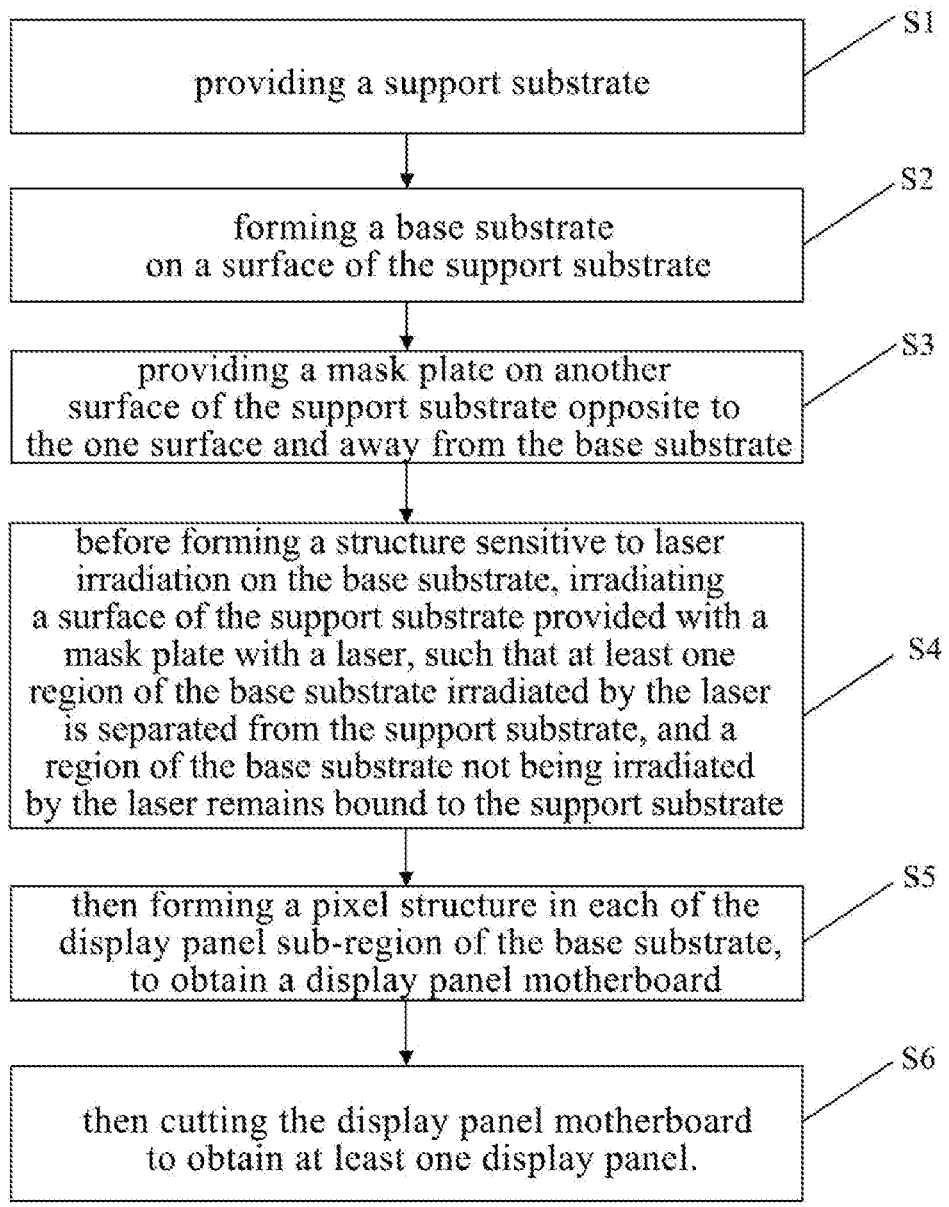
FIG. 1 is a flow chart showing a method for preparing a display panel according to an embodiment of the present disclosure.

In order to allow a person skilled in the art to better understand the technical solutions of the present disclosure, the display panel, the method for preparing the same, the display panel motherboard and the display device will be further described below in detail based on the related art in conjunction with the drawings and detailed description.

The display panel, especially the flexible display panel, includes a plurality of pixel structures, each including a thin film transistor (TFT) of a control element and a light-emitting device OLED. In the production process of the flexible display panel, after the pixel structure is prepared using the glass substrate as a support, a laser stripping process is usually used to separate the finished flexible display panel from the glass substrate. However, the use of laser irradiation can adversely affect some light-sensitive structures inside the flexible display panel, for example, the semiconductor layer of the TFT, the light-emitting layer of the OLED, etc., which degrades the display performance of the flexible display panel.

One possible solution to the above problem is to provide a light-shielding layer between the base substrate and the pixel structure, in order to prevent the laser from irradiating on the light sensitive structure within the display panel. Although the method can provide a light-shielding effect on the light-sensitive structure in the display panel, it is necessary to increase the layer structure and the preparation process of the display panel, which significantly increases the production cost.

In view of the problems in the related art, the present disclosure provides a method for preparing a display panel, which can avoid or completely eliminate the adverse effect of the laser stripping process on the light-sensitive structure inside the flexible display panel without providing a light-shielding layer, and this improves the display performance of the display panel and reduces the production cost. Optionally, the present disclosure also provides a display panel motherboard, a display panel prepared from the display panel motherboard, and a display device including the display panel free of a light-shielding layer and having improved display performance.

According to an aspect of the present disclosure, the present disclosure provides a method for preparing a display panel, including: providing a support substrate; forming a base substrate on a surface of the support substrate; providing a mask plate on another surface of the support substrate opposite to the one surface and away from the base substrate; before forming a structure sensitive to laser irradiation on the base substrate, irradiating a surface of the support substrate provided with a mask plate with a laser, wherein the mask plate includes at least one light-transmitting region, and at least one region of the base substrate is irradiated by a laser through the at least one light-transmitting region and the support substrate, such that the at least one region of the base substrate irradiated by the laser is separated from the support substrate, and a region of the base substrate not irradiated by the laser remains bound to the support substrate, in which the at least one region of the base substrate being irradiated by a laser is a display panel region, the display panel region comprises at least one display panel sub-region and the region of the base substrate not irradiated by the laser is a non-display panel region; then forming a pixel structure in each of the display panel sub-region of the flexible substrate, to obtain a display panel motherboard; and then cutting the display panel motherboard to obtain at least of separate display panel.

The above preparation method according to the present disclosure can produce the following advantageous technical effects:

In the method for preparing the display panel of the present disclosure, by advancing the laser stripping process to the preparing the pixel structure, the adverse effect of the laser stripping process on the structure sensitive to laser irradiation of the display panel can be completely avoided or eliminated without providing the light-shielding layer, and this improves the display performance of the display panel and reduces the production cost. In addition, only the flexible substrate and the structure formed on the base substrate are cut without cutting the support substrate, whereby the support substrate can be recycled, which can further reduce the production cost.

As shown in FIG. 1, the method for preparing a display panel includes the following steps S1 to S6.

Step S1: providing a support substrate.

Step S2: forming a base substrate on a surface of the support substrate.

Figure 2A:
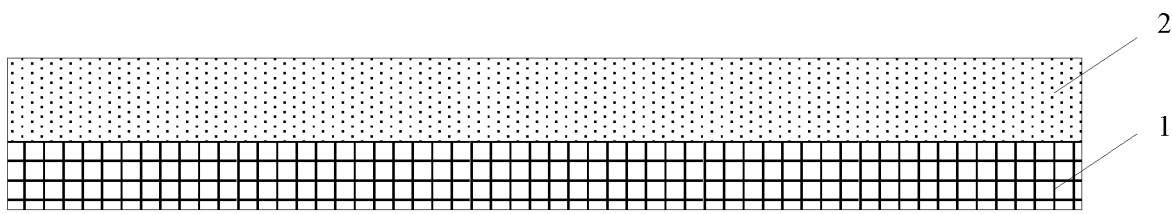
FIGS. 2A-2D are schematic views showing the structures prepared in respective steps in a method for preparing a display panel according to an embodiment of the present disclosure.

In this step, as shown in FIG. 2A, a base substrate 2 is formed on a surface of the support substrate 1 provided. Step S2 is specifically to coat a polyimide material on a surface of the support substrate 1, to form the base substrate 2. The polyimide material (PI) is an aromatic heterocyclic polymer compound having a chain containing imide groups, and has excellent mechanical properties, heat resistance and electrical properties, for example, excellent fatigue resistance, dimensional stability, friction resistance, flame retardancy, etc. Moreover, the coating process is a mature process, so the flexible substrate 2 is prepared by the coating process in the step S2, and the yield is high.

Step S3: providing a mask plate on another surface of the support substrate opposite to the one surface and away from the base substrate.

Figure 2B:
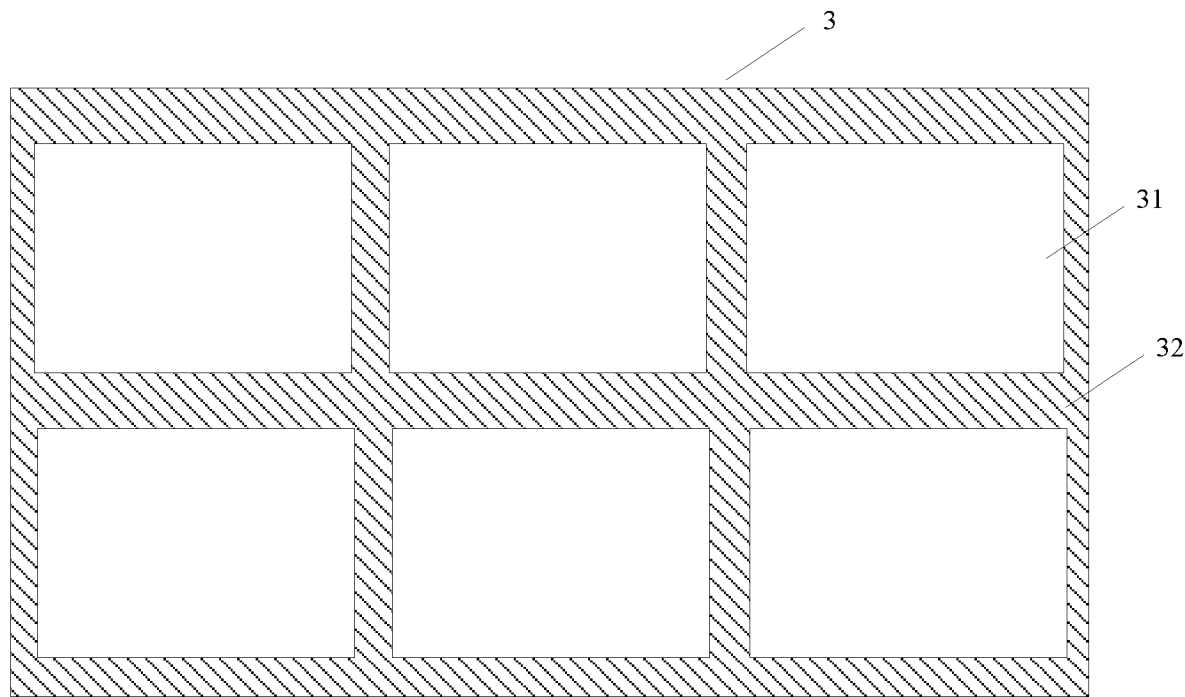

In step S3, a mask plate 3 (Mask) is provided on another surface of the support substrate 1 opposite to the one surface and away from the base substrate. The pattern of the mask 3 is, for example, as shown in FIG. 2B. The mask plate 3 includes at least one light-transmitting region 31 and a light-shielding region 32. The light-transmitting region 31 of the mask plate 3 corresponds to the display panel region, and the light-shielding region 32 corresponds to the non-display panel region. The light-transmitting region 31 (i.e., the opening region) and the light-shielding region 32 of the mask plate 3 are associated with the number, location, and shape of the display panels arranged on the display panel motherboard. The pattern of the mask plate 3 is not limited to the case shown in FIG. 2B, and may be arbitrarily arranged according to production requirements, and details are not described herein again.

Step S4: before forming a structure sensitive to laser irradiation on the base substrate, irradiating a surface of the support substrate provided with a mask plate with a laser, wherein the mask plate includes at least one light-transmitting region, and at least one region of the base substrate is irradiated by a laser through the at least one light-transmitting region and the support substrate, such that the at least one region of the base substrate irradiated by the laser is separated from the support substrate, and a region of the base substrate not irradiated by the laser remains bound to the support substrate, wherein the at least one region of the base substrate being irradiated by a laser is a display panel region, the display panel region comprises at least one display panel sub-region and the region of the base substrate not irradiated by the laser is a non-display panel region.

In step S4, a surface of the support substrate provided with a mask plate is irradiated with a laser. At least one region of the base substrate is irradiated by a laser through the at least one light-transmitting region and the support substrate, such that the at least one region of the base substrate irradiated by the laser is separated from the support substrate, and a region of the base substrate not irradiated by the laser remains bound to the support substrate. The at least one region of the base substrate being irradiated by a laser is a display panel region, the display panel region comprises at least one display panel sub-region and the region of the base substrate not irradiated by the laser is a non-display panel region.

Figure 2C:
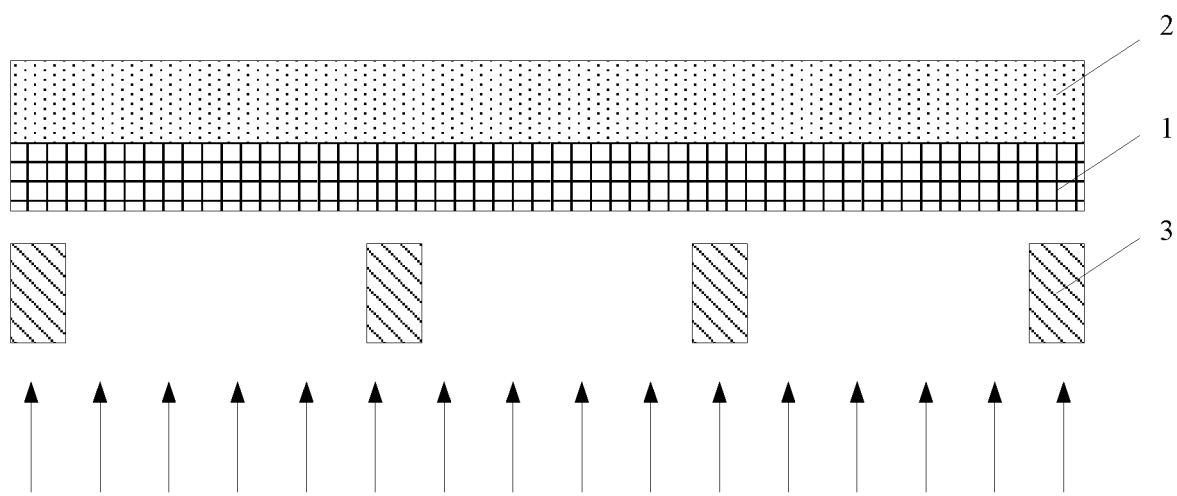

The surface of the support substrate provided with the mask plate 3 is irradiated with a laser, as shown in FIG. 2C. Optionally, in the irradiating the surface of the support substrate provided with the mask plate with the laser, the laser has irradiation energy ranging from about 290 to about 350 mJ and a wavelength ranging from about 300 to about 400 nm. The laser can ensure that the support substrate 1 is completely separated from the flexible substrate 2, and can ensure the flexible substrate 2 to have good surface flatness. If the laser energy used is too large, the flexible substrate 2 is burned by the laser to generate more ash, which may cause the surface of the flexible substrate 2 to be uneven, thereby affecting the deposition of the subsequent film layer. If the laser energy used is too small, the laser energy absorbed by the flexible substrate 2 is insufficient, and thus it is difficult to separate the flexible substrate 2 from the support substrate 1.

Figure 2D:
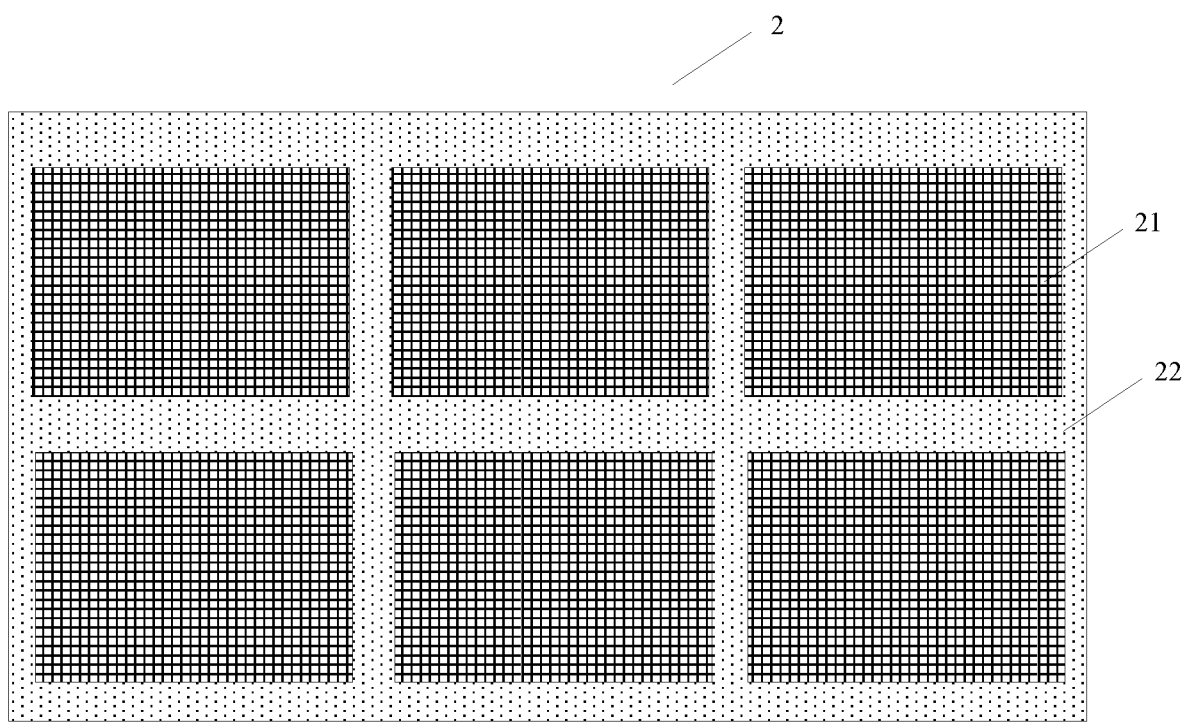

After the support substrate 1 and the flexible substrate 2 are irradiated with a laser, the flexible substrate 2 corresponding to the light-transmitting region 31 of the mask plate 3 is separated from the support substrate 1 to form a peeling region 21, and the remaining portion of the flexible substrate 2 and the support substrate 1 are still bound to each other to form a reserved region 22. The peeling region 21 is used for forming a display device structure including a pixel structure, and is therefore also referred to as a display panel sub-region. The reserved region 22 is a region of a flexible substrate corresponding to the opaque region of the mask plate, also referred to as a non-display panel region. The stripping process only partially separates in advance the flexible substrate 2 from the support substrate 1, and does not affect the preparation of the subsequent pixel structure, as shown in FIG. 2D.

Step S5: forming a pixel structure in each of the display panel sub-region of the base substrate, to obtain a display panel motherboard.

After the display panel sub-region 21 of the flexible substrate 2 is separated from the support substrate by a laser, a pixel structure including various components is prepared on the display panel. The step can avoid affecting the pixel structure when the display panel is separated by the laser after forming the pixel structure, thereby ensuring the performance of the display product.

Figure 3:
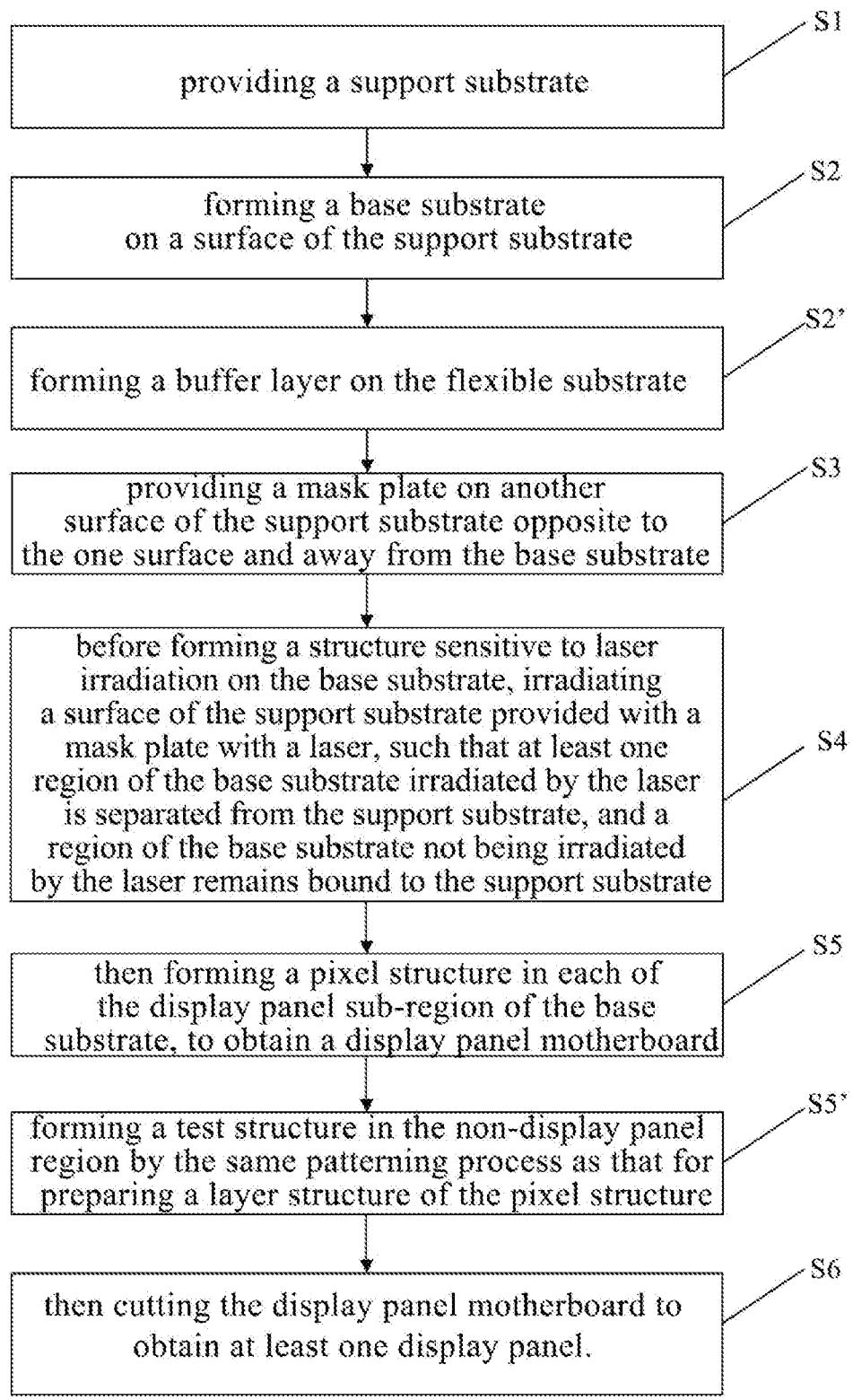
FIG. 3 is a flow chart showing a method for preparing a display panel according to another embodiment of the present disclosure.

Optionally, the display panel sub-region includes a display region and a non-display region arranged around the display region. After the region of the flexible substrate 2 corresponding to the display panel sub-region is separated from the support substrate 1, as shown in FIG. 3, the method for preparing the flexible display panel further includes: forming a pixel structure in the display region; and forming an edge lead and a driving circuit for driving the pixel structure in the non-display region. The pixel structure includes a plurality of control elements and a plurality of light-emitting devices which are stacked, and the plurality of control elements include a semiconductor layer sensitive to laser irradiation, and the plurality of light-emitting devices include at least a light-emitting layer sensitive to laser irradiation.

Figure 4A:
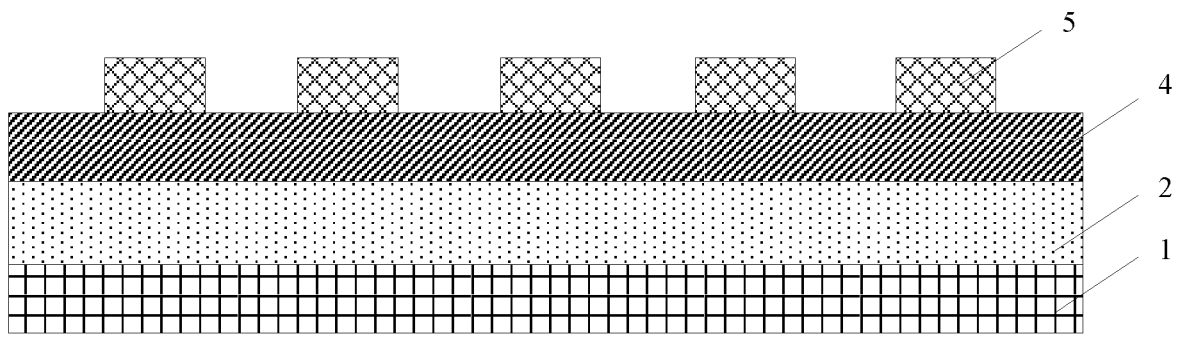
FIGS. 4A-4C are schematic views showing the structures prepared in respective steps in a method for preparing a display panel according to another embodiment of the present disclosure.
Figure 4B:
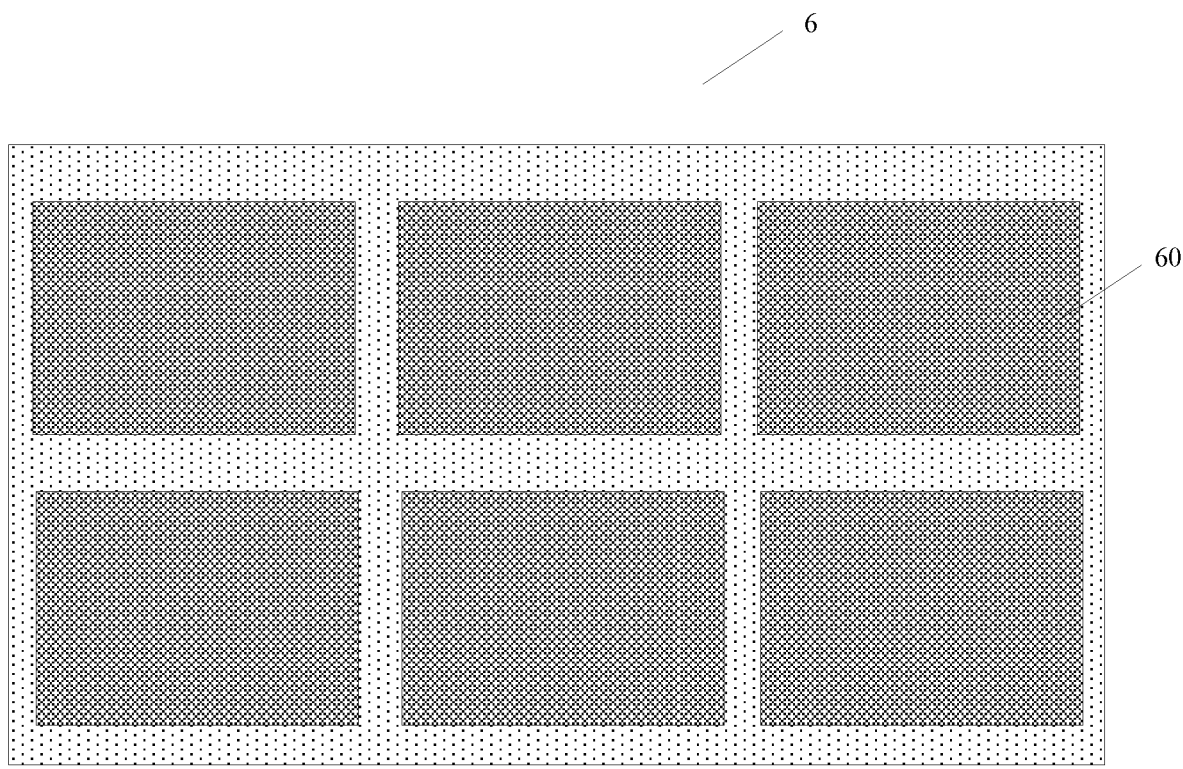

FIG. 4A is a simple schematic cross-sectional view showing the structure of the display panel prepared in this step. The flexible substrate 2 is located on the support substrate, and the pixel structure 5 and the package structure (not shown in FIG. 4A) are formed in the display panel sub-region corresponding to the separation region. After the cutting, the display panel motherboard 6 including a plurality of flexible display panels 60 is prepared, as shown in FIG. 4B. The pixel structure 5 is formed in the display panel sub-region, in which the pixel structure includes a plurality of control elements and a plurality of light-emitting devices which are stacked, and the plurality of control elements include at least a semiconductor layer sensitive to laser irradiation, and/or the plurality of light-emitting devices include a light-emitting layer sensitive to laser irradiation. Optionally, the plurality of control elements are thin film transistors (TFT), and the plurality of light-emitting devices include organic light-emitting diodes (OLED) or quantum dot light-emitting diodes (QLED). This method is suitable for the preparation of OLED and QLED in flexible arrangements.

Step S6: cutting the display panel motherboard to obtain a separate display panel.

Figure 4C:
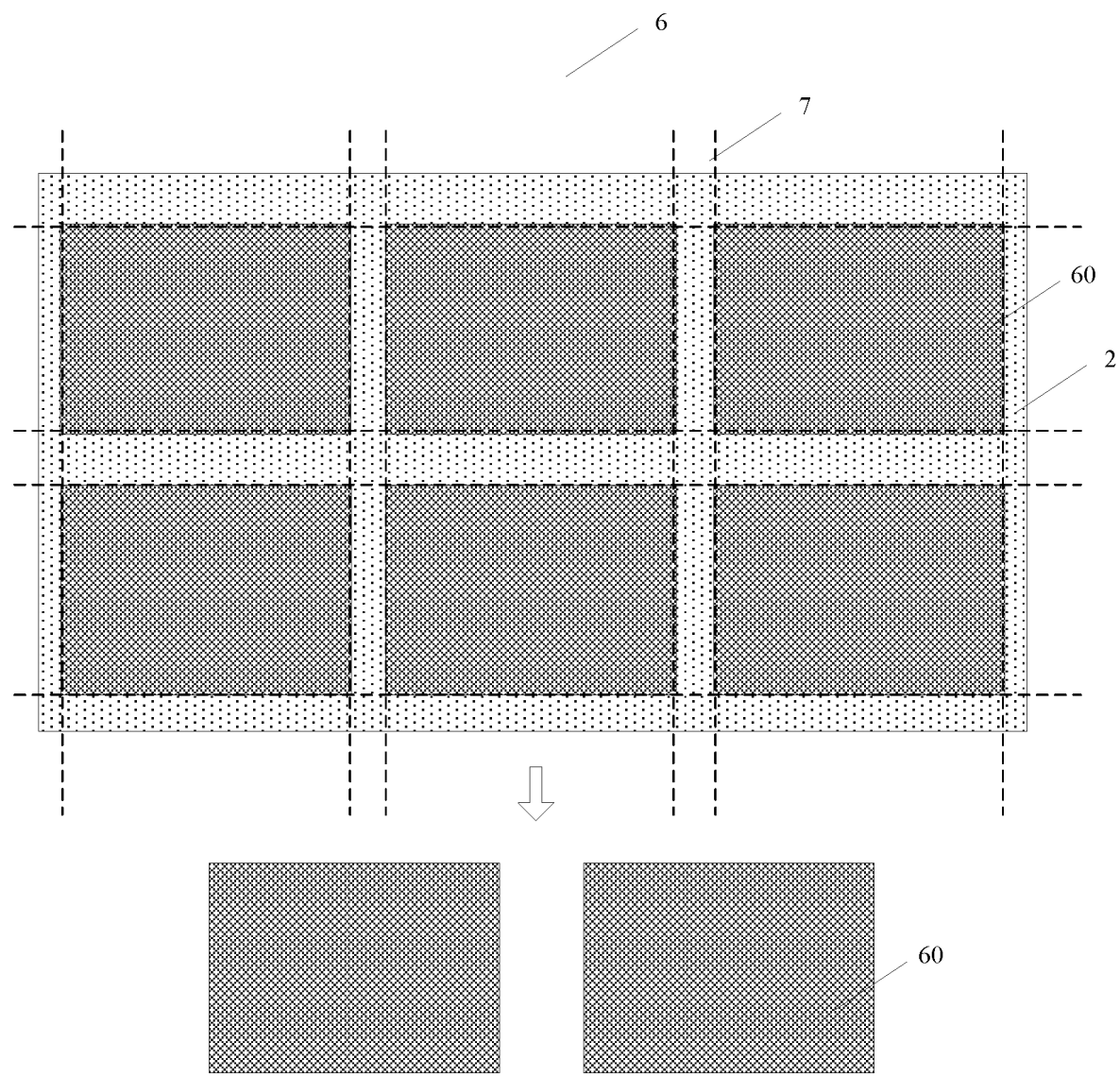

In step S6, cutting is preformed along the edge of the display panel sub-region or in the non-display region of the display panel sub-region, to obtain a separate display panel (or flexible display panel), in which the base substrate (or the flexible substrate) is separated from the support substrate. Since the display panel sub-region of the base substrate has been separated from the support substrate 1 in the previous process, a plurality of display panels 60 can be directly obtained after the cutting step, as shown in FIG. 4C. Through the cutting step, a plurality of separate display panels 60 can be obtained at one time from the display panel motherboard 6.

Optionally, in the above cutting step, only the base substrate and the structure formed on the base substrate are cut without cutting the support substrate 1.

Specifically, the cutting line 7 in FIG. 4C is cut along the edge of the display panel sub-region or in the non-display region of the display panel sub-region. For example, the edge between the display panel sub-region and the non-display panel region is cut along a line at a distance of about 10 μm from the edge of the display panel sub-region. Typically, the cutting machine has an accuracy of approximately 10 μm. The cutting along the edge between the display panel sub-region and the non-display panel region or along a line at a distance of about 10 μm from the edge of the display panel sub-region ensures that the support substrate 1 and the base substrate 2 are completely separated on one hand, and ensures that the cutting process adversely affects the drive circuit and line in the display panel sub-region on the other hand.

Optionally, by using the laser cutting process and through controlling the cutting depth, the cutting process cuts only to the flexible substrate 2 without cutting to the support substrate 1. This eliminates the need for a splitting process that is usually necessary after cutting, and avoids the cutting process from damaging the drive circuit and line, thin film transistors, etc. in the display panel sub-region. In addition, the support substrate 1 requires a space for preparing an electrical test structure and an optical test structure. Therefore, the proportion of the display panel on the support substrate 1 is unlikely to reach 100%, and there must be a region where the flexible substrate 2 is bonded to the support substrate 1 after the laser peeling process. After the display panel is removed, the excess substrate 2 of the support substrate 1 is removed by a laser and cleaned, such that the support substrate 1 can be recycled repeatedly, thereby reducing the production cost.

Further, the method of the present disclosure further includes the following steps S2' and S5'.

Optionally, after step S2 of the above method, the method further includes step S2': forming a buffer layer on the base substrate. Specifically, FIG. 4A is a simple schematic cross-sectional view showing the structure of the display panel prepared in this step. The buffer layer 4 is prepared on the base substrate 2 on the support substrate, and then the pixel structure 5 and the package structure (not shown in FIG. 4A) are formed in the display panel sub-region corresponding to the separation region on the buffer layer 4. After the cutting, the display panel motherboard 6 including a plurality of display panels 60 is prepared, as shown in FIG. 4B.

Optionally, after step S5 of the above method, the method further includes step S5': forming a test structure in the non-display panel region by the same patterning process as that for preparing a layer structure of the pixel structure. The test structure includes an array test pad for electrically testing the plurality of control elements and an optical test pad for optically testing the plurality of light-emitting devices, such as little test cell (LTC). The structural settings in the non-display panel region are the same as those of the prior art. The present disclosure completes the preparation and testing of the test structure prior to cutting. Through step S5', the display device is formed in the display region of the display panel sub-region, and the drive circuit is formed in the non-display region.

In the method for preparing the display panel of the present disclosure, by advancing the laser stripping process to the preparing of the pixel structure, the effect of the laser stripping process on the light-sensitive structure of the flexible display panel can be completely eliminated without providing the light-shielding layer, and this improves the display performance of the flexible display panel and reduces the production cost.

According to another embodiment of the present disclosure, there is provided a display panel motherboard prepared in the above method, the display panel motherboard including: a support substrate, a base substrate formed on a surface of the support substrate, and a pixel structure formed on a surface of the base substrate away from the support substrate, in which the display panel motherboard includes at least one display panel sub-region and a non-display panel region arranged around the display panel sub-region, and the pixel structure is arranged in the display panel sub-region; and in which a part of the base substrate located on the display panel sub-region is separated from the support substrate, and the other part of the base substrate located on the non-display panel region remains bound to the support substrate; and in which the display panel motherboard is free of a light-shielding layer. In the display panel motherboard of the present disclosure, first the display panel is separated from the support substrate by a laser, and then a pixel structure is prepared in the display panel sub-region, thereby ensuring the performance of the display product.

Optionally, the base substrate is a flexible substrate, and the display panel is a flexible display panel, and the display panel sub-region includes a display region and a non-display region arranged outside the display region. The pixel structure is arranged in the display region. The non-display region is used to set the edge lead and the driving circuit for driving the pixel structure. Optionally, the pixel structure includes a plurality of control elements and a plurality of light-emitting devices which are stacked. The plurality of control elements include at least a semiconductor layer sensitive to laser irradiation, and/or the plurality of light-emitting devices include at least a light-emitting layer sensitive to laser irradiation. Optionally, the plurality of control elements are thin film transistors, and the plurality of light-emitting devices include organic light-emitting diodes or quantum dot light-emitting diodes.

Optionally, in the display panel motherboard of the present disclosure, the non-display panel region is further provided with a test structure. The test structure includes an array test pad for electrically testing the plurality of control elements and an optical test pad for optically testing the plurality of light-emitting devices, such as little test cell. The prepared structure can be tested prior to cutting. The structural settings of the non-display panel region are the same as those of the prior art, and are not described herein again.

According to still another embodiment of the present disclosure, there is provided a display panel prepared by the above method for preparing a display panel, or obtained by cutting the display panel motherboard of the above embodiment, which comprises a base substrate and a pixel structure arranged on the base substrate, and in which the display panel is free of a light-shielding layer, the pixel structure comprises a plurality of control elements and a plurality of light-emitting devices which are stacked, and the plurality of control elements comprise at least a semiconductor layer sensitive to laser irradiation, and/or the plurality of light-emitting devices comprise at least a light-emitting layer sensitive to laser irradiation.

The display panel of the present disclosure is obtained by the above method or by cutting the display panel motherboard, free of the light-shielding plate provided in the related art, and avoids the adverse effect of laser irradiation on the light-emitting device or the transistor device during the preparation process, so that the performance of the display panel is improved.

According to still another embodiment of the present disclosure, there is provided a display device including the display panel according to the above embodiment. The display device can be a desktop computer, a tablet computer, a notebook computer, a mobile phone, a PDA, a GPS, a car display, a projection display, a video camera, a digital camera, an electronic watch, a calculator, an electronic instrument, a meter, a liquid crystal panel, an electronic paper, a television, a monitor, a digital photo frame, a navigator, or any product or component having display function, and can also be applied to many fields, such as public display and unreal display.

Since the display panel prepared by the present disclosure has improved performance, the display device also has a corresponding display effect accordingly.

The above embodiments are merely exemplary embodiments to explain the principles of the present disclosure, but the present disclosure is not limited thereto. One skilled in the art would make various modifications and improvements without departing from the spirit and principle of the present disclosure. These modifications and improvements should also be regarded as the protection scope of the present disclosure.

What is claimed is:

1. A method for preparing a display panel, comprising:
providing a support substrate;
forming a base substrate on one surface of the support substrate;
providing a mask plate on another surface of the support substrate opposite to the one surface and away from the base substrate;
before forming a structure sensitive to laser irradiation on the base substrate, irradiating a surface of the support substrate provided with a mask plate with a laser, wherein the mask plate comprises at least one light-transmitting region, and at least one region of the base substrate is irradiated by a laser through the at least one light-transmitting region and the support substrate, such that the at least one region of the base substrate irradiated by the laser is separated from the support substrate, and a region of the base substrate not irradiated by the laser remains bound to the support substrate, wherein the at least one region of the base substrate being irradiated by a laser is a display panel region, the display panel region comprises at least one display panel sub-region and the region of the base substrate not irradiated by the laser is a non-display panel region;
then forming a pixel structure in each of the display panel sub-region of the base substrate to obtain a display panel motherboard; and
then cutting the display panel motherboard to obtain at least one display panel,
wherein the display panel sub-region comprises a display region and a non-display region arranged around the display region, and wherein the pixel structure comprises a plurality of control elements and a plurality of light-emitting devices which are stacked, and the plurality of control elements comprise at least a semiconductor layer sensitive to laser irradiation, and/or the plurality of light-emitting devices comprise at least a light-emitting layer sensitive to laser irradiation.

2. The method of claim 1, wherein the step of cutting the display panel motherboard comprises cutting along the edge of the display panel sub-region or in the non-display region of the display panel sub-region, to obtain at least one separate display panel, in which the base substrate is separated from the support substrate.

3. The method of claim 2, wherein the step of cutting the display panel motherboard comprises cutting along a line in the display panel sub-region at a distance of about 10 μm from the edge of the display panel sub-region.

4. The method of claim 2, wherein in the step of cutting, only the base substrate and the structure formed on the base substrate are cut without cutting the support substrate.

5. The method of claim 1, wherein the base substrate is a flexible substrate, and the display panel is a flexible display panel, and wherein the step of forming the base substrate on a surface of the support substrate comprises: coating a polyimide solution on a surface of the support substrate to form the flexible substrate.

6. The method of claim 1, wherein in the step of irradiating a surface of the support substrate provided with the mask plate with the laser, the laser has irradiation energy ranging from about 290 to about 350 mJ and a wavelength ranging from about 300 to about 400 nm.

7. The method of claim 6, wherein the cutting is performed using a laser process.

8. The method of claim 7, wherein the support substrate is a support substrate recycled after being cut by the laser to remove the base substrate.

9. The method of claim 1, wherein the plurality of control elements are thin film transistors, and the plurality of light-emitting devices comprise organic light-emitting diodes or quantum dot light-emitting diodes.

10. The method of claim 1, wherein the method further comprises:

forming a plurality of edge leads and a plurality of driving circuits for driving the pixel structure in the non-display region; and forming a test structure in the non-display panel region by a same patterning process as that for preparing a layer of the pixel structure, wherein the test structure comprises an array test pad for electrically testing the plurality of control elements and an optical test pad for optically testing the plurality of light-emitting devices.

* * * * *